(12) United States Patent
Levinson et al.

(10) Patent No.: US 7,851,136 B2
(45) Date of Patent: Dec. 14, 2010

(54) STABILIZATION OF DEEP ULTRAVIOLET PHOTORESIST

(75) Inventors: Harry J. Levinson, Saratoga, CA (US); Ryoung-han Kim, San Jose, CA (US); Thomas I. Wallow, San Carlos, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 696 days.

(21) Appl. No.: 11/421,327

(22) Filed: May 31, 2006

(65) Prior Publication Data

US 2007/0281248 A1   Dec. 6, 2007

(51) Int. Cl.
G03F 7/26 (2006.01)
(52) U.S. Cl. .................. 430/313; 430/328; 430/330
(58) Field of Classification Search ............. 430/311, 430/313, 322, 323, 328, 330
See application file for complete search history.

(56) References Cited

U.S. PATENT DOCUMENTS

| | | | | |
|---|---|---|---|---|
| 4,548,688 | A | * | 10/1985 | Matthews ............... 430/281.1 |
| 6,576,405 | B1 | * | 6/2003 | Buffat et al. ............... 430/322 |
| 6,589,709 | B1 | | 7/2003 | Okoroanyanwu et al. |
| 6,716,570 | B2 | * | 4/2004 | Nagarajan et al. ........... 430/311 |
| 6,815,359 | B2 | | 11/2004 | Gabriel et al. |
| 6,866,972 | B2 | * | 3/2005 | Ishino ...................... 430/7 |
| 6,900,001 | B2 | | 5/2005 | Livesay et al. |

FOREIGN PATENT DOCUMENTS

KR   19980028362   *   7/1998

OTHER PUBLICATIONS

Hiroko Nakamura et al., Contact Hole Formation by Multiple Exposure Technique in Ultra-low K1 Lithography, Optical Microlithography XVII, 2004, pp. 255-263, vol. 5377, Bellingham, WA, 2004.
Koji Nozaki et al., High-Performance Resist Materials for ArF Excimer Laser and Electron Beam Lithography, Fujitsun Science Tech. J., pp. 3-12, Jun. 2002.

* cited by examiner

*Primary Examiner*—Kathleen Duda
(74) *Attorney, Agent, or Firm*—Ingrassia Fisher & Lorenz, P.C.

(57) ABSTRACT

An integrated circuit fabrication process as described herein employs a photoresist stabilization step where patterned photoresist material is exposed to radiation having a wavelength that promotes cross-linking in the shallow surfaces of the patterned photoresist features. The patterned photoresist material is highly absorptive of the stabilizing radiation, which results in the surface cross-linking and modification of the outer surfaces of the patterned photoresist material. This modified "shell" is immune to photoresist developer, photoresist solvents, intense ion implantation, and intense etchants. The shell also enables for the resist not to deform when baked at a temperature above its glass transition temperature. For example, the photoresist stabilization technique can be used in a double exposure process such that a patterned photoresist layer remains intact during a subsequent lithographic sub-process.

17 Claims, 5 Drawing Sheets

STABILIZATION OF DEEP ULTRAVIOLET PHOTORESIST

TECHNICAL FIELD

Embodiments of the present invention relate generally to integrated circuit (IC) fabrication. More particularly, embodiments of the present invention relate to a technique for improving the stability of deep ultraviolet photoresist utilized in IC fabrication.

BACKGROUND

The semiconductor or IC industry aims to manufacture ICs with higher and higher densities of devices on a smaller chip area to achieve greater functionality and to reduce manufacturing costs. This desire for large scale integration has led to a continued shrinking of circuit dimensions and device features. The ability to reduce the size of structures, such as gate lengths in field-effect transistors and the width of conductive lines, is driven by lithographic performance.

With conventional lithography systems, radiation is provided through or reflected off a mask or reticle to form an image on a semiconductor wafer. Generally, the image is focused on the wafer to expose and pattern a layer of material, such as photoresist material. In turn, the photoresist material is utilized to define doping regions, deposition regions, etching regions, or other structures associated with ICs in one or more layers of the semiconductor wafer. The photoresist material can also define conductive lines or conductive pads associated with metal layers of an IC. Further, the photoresist material can define isolation regions, transistor gates, or other transistor structures and elements.

Older lithography systems are typically configured to expose the photoresist material at a radiation having a wavelength of 248 nanometers (nm). However, because the resolution limit of features is, in part, dependent upon the exposure wavelength, it is desirable to pattern photoresist material using radiation at shorter exposure wavelengths (e.g., the wavelength range bounded approximately by, and including, 193 nm to 13.4 nm (193 nm, 157 nm, 126 nm, or 13.4 nm)). Unfortunately, materials, equipment, and/or fabrication techniques suitable for 248 nm lithography are not generally transferable to shorter exposure wavelengths, and materials, equipment and processes tailored for use with shorter exposure wavelengths are required.

The stability of a developed photoresist pattern can be important in a number of practical semiconductor manufacturing processes, for example, double exposure processes, processes that include an intense ion implantation step, and/or processes that include an intense etching step. In one instance of a double exposure process, the semiconductor wafer is subjected to two lithography sub-processes, where the first developed photoresist pattern must tolerate the application of the second photoresist layer, the exposure of the second photoresist layer, and the development of the second photoresist layer. The chemicals and solvents used during the second lithography sub-process can harm the first developed photoresist pattern, resulting in distortion of the first developed photoresist pattern. Likewise, subjecting a developed photoresist pattern to intense ion implantation and/or intense etching can distort, destroy, melt, or otherwise harm the developed photoresist pattern.

BRIEF SUMMARY

The techniques and technologies described herein can be utilized to stabilize a deep ultraviolet (DUV) photoresist layer such that the stabilized DUV photoresist layer can tolerate subsequent fabrication steps or sub-processes. Typical DUV photoresists are exposed using KrF or ArF excimer laser, with wavelengths of approximately 248 nm and 193 nm, respectively (the patterning exposure). A developed DUV photoresist layer is treated subsequently with light having a wavelength at which the developed DUV photoresist layer is absorptive of the light, resulting in surface modification of the developed DUV photoresist layer (the stabilizing exposure). In this regard, the techniques and technologies described herein are applicable to a DUV process that involves a photoresist patterned using the wavelength range bounded approximately by, and including, 248 nm to 13.4 nm. Depending on the specific photoresist material and process employed, the stabilizing exposure alone may be sufficient to modify the photoresist surface, or a bake process following the stabilizing exposure may be desirable or necessary to improve the stabilization.

One embodiment may be carried out by an integrated circuit fabrication method. The method involves: patterning a photoresist layer disposed over a target material by exposing the photoresist layer to radiation having a deep ultraviolet wavelength (the imaging wavelength); developing the photoresist layer into a patterned photoresist layer; and stabilizing the patterned photoresist layer by exposing the patterned photoresist layer to radiation having a wavelength (the stabilizing wavelength) for which the patterned photoresist layer is highly absorptive. Depending on the specific photoresist material and process employed, the stabilizing exposure alone may be sufficient to modify the photoresist surface, or a bake process following the stabilizing exposure may be desirable or necessary to improve the stabilization.

Another embodiment may be carried out by an integrated circuit fabrication method that involves: depositing a deep ultraviolet photoresist material over a semiconductor substrate; exposing the deep ultraviolet photoresist material with patterned radiation having a first wavelength for which the deep ultraviolet photoresist material is usefully transparent for patterning; developing the deep ultraviolet photoresist material into a patterned photoresist layer having at least one feature having an outer surface; and modifying the outer surface by exposing the patterned photoresist layer to radiation having a second wavelength for which the patterned photoresist layer is opaque. Depending on the specific photoresist material and process employed, the stabilizing exposure alone may be sufficient to modify the photoresist surface, or a bake process following the stabilizing exposure may be desirable or necessary to improve the stabilization.

Another embodiment may be carried out by an integrated circuit fabrication method that involves: depositing a deep ultraviolet photoresist material over a target material; patterning the deep ultraviolet photoresist material by exposing it to radiation having a wavelength of 248 or 193 nanometers; developing the deep ultraviolet photoresist material into patterned photoresist material having at least one feature with an outer surface; and exposing the patterned photoresist material to radiation having a wavelength that does not exceed 180 nanometers to modify the patterned photoresist material proximate the outer surface. Depending on the specific photoresist material and process employed, the stabilizing exposure alone may be sufficient to modify the photoresist surface, or a bake process following the stabilizing exposure may be desirable or necessary to improve the stabilization.

BRIEF DESCRIPTION OF THE DRAWINGS

A more complete understanding of the present invention may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the invention or the application and uses of such embodiments. For the sake of brevity, conventional techniques related to photolithography and semiconductor device fabrication may not be described in detail herein.

Figure 1:
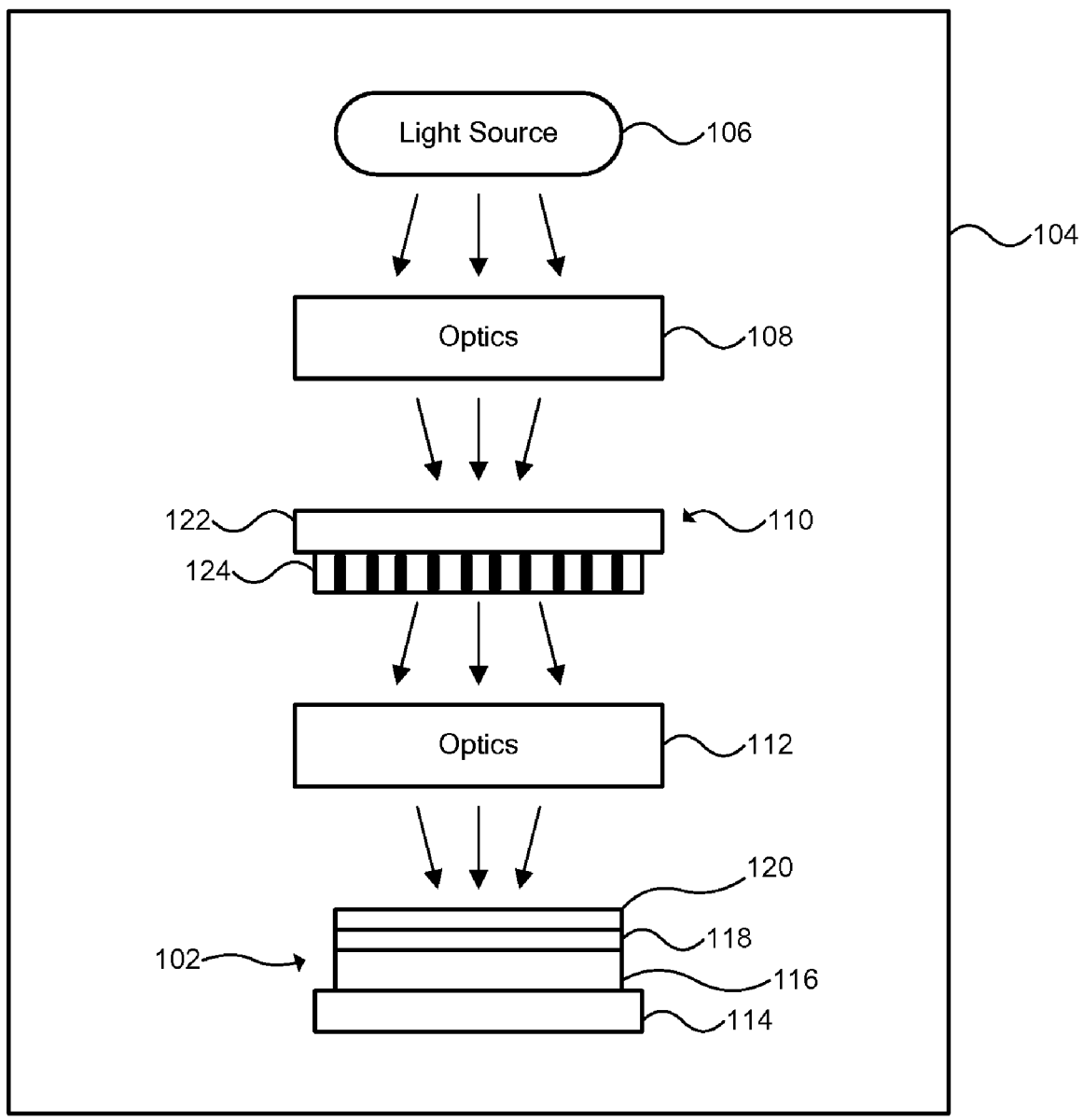
FIG. 1 is a schematic representation of a lithographic system for patterning a wafer.

FIG. 1 is a schematic representation of a lithographic system 100 for patterning a wafer 102. Lithographic system 100 includes a chamber 104, a light source 106, a condenser lens assembly 108 (labeled "Optics" in FIG. 1), a mask or a reticle 110, an objective lens assembly 112 (labeled "Optics" in FIG. 1), and a stage 114. Lithographic system 100 is configured to transfer a pattern or image provided on mask or reticle 110 to a target material or surface of wafer 102. Lithographic system 100 may be a lithographic camera or stepper unit. For example, lithographic system 100 may be an XT1400 series machine manufactured by ASML or an S308F system from Nikon.

Wafer 102 includes a substrate 116, a layer 118, and a photoresist layer 120. Photoresist layer 120 is disposed over layer 118, and layer 118 is disposed over substrate 116. Wafer 102 depicted in FIG. 1 can be an entire IC wafer or a portion of an IC wafer. Wafer 102 can be a portion of an IC, such as a memory, a processing unit, an input/output device, or the like, of multiple ICs. Substrate 116 can be a semiconductor substrate, such as silicon, gallium arsenide, germanium, or any suitable substrate material. Substrate 116 can include one or more layers of material and/or features, such as lines, interconnects, vias, doped regions, or the like, and substrate 116 can further include devices, such as transistors, microactuators, microsensors, capacitors, resistors, diodes, or the like.

Layer 118 can be an insulative layer, a conductive layer, a barrier layer, or any target material to be etched, doped, treated, processed, or layered. In one embodiment, layer 118 includes one or more layers of materials, such as polycrystalline silicon and/or one or more of titanium silicide, tungsten silicide, cobalt silicide, and/or other materials alone or in alternating layers. In another embodiment, layer 118 is a hard mask layer, such as a silicon nitride layer or a metal layer. The hard mask layer can serve as a patterned layer for processing substrate 116 or for processing a layer upon substrate 116. In yet another embodiment, layer 118 is an anti-reflective coating (ARC). Substrate 116 and layer 118 are not described in a limiting fashion, and can each comprise a conductive, semiconductive, or insulative material.

Photoresist layer 120 can comprise a variety of photoresist materials, compositions, or chemicals suitable for lithographic applications. Photoresist layer 120 is selected to have photochemical reactions in response to electromagnetic radiation emitted from light source 106 and to have sufficient transparency to the electromagnetic radiation to allow useful patterning of the photoresist layer. Materials comprising photoresist layer 120 can include, among others, a matrix material or resin, a sensitizer or inhibitor, and a solvent. Photoresist layer 120 may be a chemically amplified, positive or negative tone, organic-based photoresist. Photoresist layer 120 may also be a silicon-containing photoresist. Photoresist layer 120 may be, but is not limited to, an acrylate-based polymer, an alicyclic-based polymer, or a phenolic-based polymer. In embodiments described herein, photoresist layer 120 includes a DUV photoresist material having chemical properties and characteristics that facilitates patterning by exposure to radiation having a DUV wavelength.

Photoresist layer 120 is formed over the target material or layer of wafer 102 using any suitable technique. For example, photoresist layer 120 may be deposited by spin coating over layer 118. The thickness of photoresist layer 120 is selected according to the particular lithographic technology, e.g., for use in vacuum ultraviolet (VUV) lithography, DUV lithography, and/or extreme ultraviolet lithography (using, for example, exposing light having a wavelength of 193 nm, 157 nm, 126 nm, or 13.4 nm). In this regard, photoresist layer 120 may have a thickness in the range of 15-1000 nm, with a preferred thickness in the range of 50-500 nm.

Chamber 104 of lithographic system 100 can be a vacuum for EUV lithography or a nitrogen filled chamber for use in VUV lithography. Chamber 104 can contain any of numerous types of atmospheres, such as air, nitrogen, etc. Alternatively, lithographic system 100 can be utilized in various other types of lithography including lithography that uses electromagnetic radiation at any number of wavelengths, or electron and/or ion beams.

Light source 106 provides light or electromagnetic radiation through condenser lens assembly 108, mask or reticle 110, and objective lens assembly 112 to photoresist layer 120. In one embodiment, light source 106 may be an excimer laser that produces light having a wavelength of 248 nm, 193 nm, 172 nm, 157 nm, or 126 nm, or a soft x-ray source that produces light having a wavelength of 13.4 nm. Alternatively, light source 106 may be any suitably configured light source capable of emitting radiation having a wavelength in the ultraviolet (UV), vacuum ultraviolet (VUV), deep ultraviolet (DUV), extreme ultraviolet (EUV), or x-ray range. Alternatively, the system may utilize a suitably configured electron/ion beam source.

Assemblies 108 and 112 include lenses, mirrors, collimators, beam splitters, and/or other optical components to suitably focus and direct a pattern of radiation (i.e., radiation from light source 106 as modified by a pattern or image provided on mask or reticle 110) onto photoresist layer 120. Stage 114 supports wafer 102 and can move wafer 102 relative to assembly 112.

Mask or reticle 110 is a binary mask in one embodiment. Mask or reticle 110 includes a transparent or translucent substrate 122 (e.g., glass or quartz) and an opaque or patterned layer 124 (which may be formed from chromium or chromium oxide) thereon. Opaque layer 124 provides a pattern or image associated with a desired circuit pattern, features, or devices to be projected onto photoresist layer 120.

Alternatively, mask or reticle 110 may be an attenuating phase shift mask, an alternating phase shift mask, or other type of mask or reticle.

FIGS. 2-8 are cross sectional views of a wafer undergoing a double exposure fabrication process. The double exposure fabrication process may be utilized to fabricate an IC having close tolerances between circuit features and/or very narrow line widths. Portions of the double exposure fabrication process may be performed by a lithographic system such as lithographic system 100. In practice, a double exposure fabrication process may include any number of additional or alternative tasks, and the depicted double exposure process may be incorporated into a more comprehensive manufacturing process having additional process steps that are not described in detail herein. Moreover, well known and conventional fabrication steps and techniques will not be described in detail herein.

Figure 2:
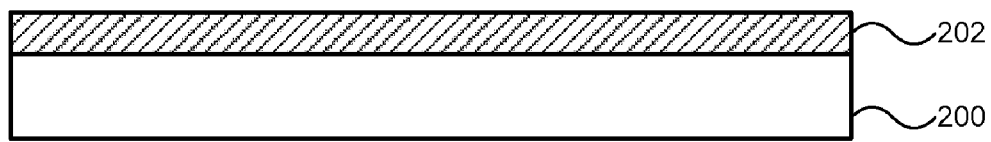
FIGS. 2-8 are cross sectional views illustrating a wafer undergoing a double exposure fabrication process.

FIG. 2 depicts a target material of the wafer, which in this example is a semiconductor substrate 200. After appropriate treatment and preparation of semiconductor substrate 200, a suitable photoresist material is deposited over semiconductor substrate 200, forming a photoresist layer 202. In this embodiment, the photoresist material is a DUV photoresist material, e.g., a 248 nm photoresist material or a 193 nm photoresist material. As mentioned above, photoresist layer 202 may be formed by spin coating the photoresist material onto semiconductor substrate 200. Photoresist layer 202 may be subjected to a pre-exposure baking step to prepare it for exposure.

Figure 3:
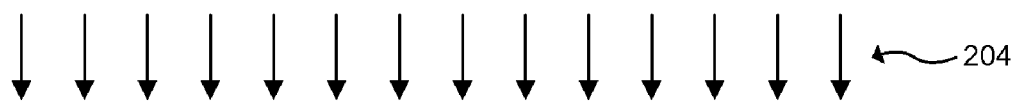
Figure 3:
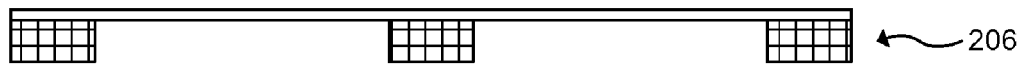

FIG. 3 depicts patterning of photoresist layer 202, which is accomplished by exposing photoresist layer 202 to radiation 204 having a DUV wavelength. In certain embodiments, the DUV radiation 204 has a wavelength of 248 nm or 193 nm. As described above in the context of lithographic system 100, this DUV radiation 204 passes through various optical elements and a mask or reticle 206 that contains a desired pattern. Thus, the pattern or image provided on mask or reticle 206 is transferred to photoresist layer 202, which chemically reacts to the DUV radiation 204. In practice, the photoresist material in photoresist layer 202 is sufficiently transparent to the DUV radiation to allow useful patterning of the photoresist layer.

Figure 4:
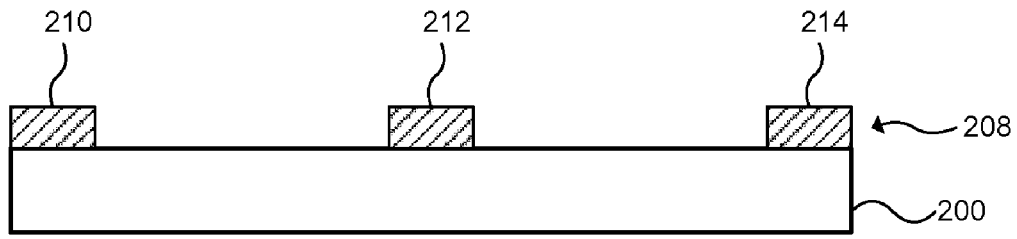

Next, the wafer, including the exposed photoresist layer 202, undergoes development to form a patterned photoresist layer. FIG. 4 depicts the resulting patterned photoresist layer 208. The developing step eliminates some of the photoresist material to define features (such as a feature 210, a feature 212, and a feature 214) in patterned photoresist layer 208. A given feature can define, but is not limited to, a conducting line, a transistor gate, a contact hole, a via, or a trench. The size and shape of these features are not shown in a limiting fashion. As described in more detail below, a given feature may have an outer or exposed surface, e.g., a top surface and/or any number of side surfaces.

In one embodiment, FIG. 4 represents the result of the first lithographic sub-process in a double exposure device fabrication process. In accordance with such a double exposure process, after the patterned photoresist layer 208 has been developed but before its pattern is transferred onto any of the underlying layers, the patterned photoresist layer 208 can be stabilized such that it becomes "immune" to the subsequent lithographic sub-process. In other words, the patterned photoresist layer 208 is treated such that it becomes insoluble to resist developer and insoluble to solvents used in applying subsequent coatings of photoresist. It should be understood that the wafer may be removed from the chamber of the lithographic system and placed within a different chamber and/or a different environment which facilitates the stabilization techniques and technologies described herein. Alternatively, the chamber of the lithographic system may be suitably configured to include additional chambers and/or tools suitable to perform the stabilization step(s).

Figure 5:
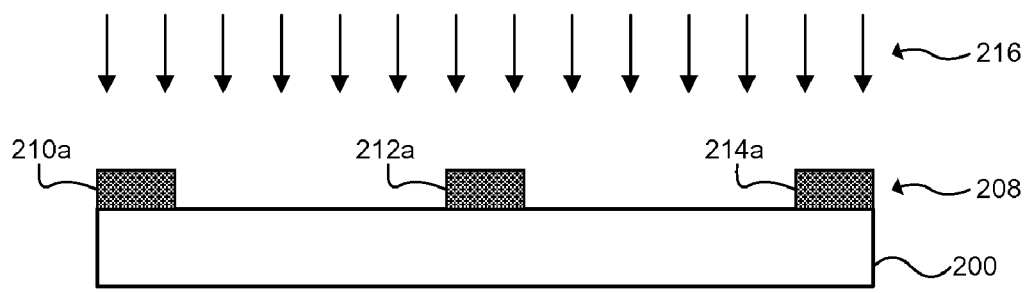

FIG. 5 depicts a process step wherein the patterned photoresist layer 208 is exposed to radiation 216 having a wavelength for which the patterned photoresist layer 208 is highly absorptive or opaque (in contrast to the DUV radiation 204 that was used to expose photoresist layer 202; see FIG. 3). The wavelength of radiation 216 is shorter than the wavelength of DUV radiation 204, and selection of the specific wavelength of radiation 216 may be based upon the specific wavelength of DUV radiation 204, the desired transformation characteristics of the photoresist material, and/or the particular chemical properties of the photoresist material. In practice, the wavelength of radiation 216 is selected to facilitate the selective absorption of energy at or near the outer exposed surface(s) of the features to be stabilized. For example, if the wavelength of DUV radiation 204 is 248 nm, then the wavelength of radiation 216 preferably does not exceed 220 nm. As another example, if the wavelength of DUV radiation 204 is 193 nm, then the wavelength of radiation 216 preferably does not exceed 180 nm. Generally, as the wavelength of radiating light becomes shorter, a DUV photoresist material becomes more absorptive and opaque. Depending on the specific photoresist material and process employed, the stabilizing exposure alone may be sufficient to modify the photoresist surface, or a bake process following the stabilizing exposure may be desirable or necessary to improve the stabilization.

The wavelength of radiation 216 is shorter than the wavelength of DUV radiation 204 to prevent distortion of the patterned photoresist layer 208. If DUV radiation is also used in an attempt to stabilize the patterned photoresist layer 208, then the photoresist material (which is transparent to DUV radiation) will react to the DUV radiation and its internal structure will be altered, resulting in shrinkage of the patterned features. Accordingly, the wavelength of radiation 216 is selected to be shorter than the wavelength of DUV radiation 204 such that radiation 216 is absorbed immediately in the shallow surface of the photoresist material rather than entering deep into the photoresist material.

In FIG. 5, the darkened features (reference numbers 210a, 212a, and 214a) represent transformed versions of the counterpart features depicted in FIG. 4. The transformed features correspond to stabilized photoresist material. In one embodiment, the stabilization step transforms the composition of the top surface and the side surfaces of these features into modified surfaces, where the modified surfaces provide protection against distortion, shrinkage, melting, and damage that might otherwise be caused by later process steps. The modified surfaces are also resistant to deformation at elevated temperatures. While the scope and application of embodiments of the invention are not limited to any particular underlying mechanistic interpretation of the modification process, the modification is most likely associated with cross-linking of the photoresist material proximate the top and side surfaces of the features. The exposed surfaces are cross-linked, becoming harder or structurally more rigid and, therefore, more resistant to high-energy ion implantation, reactive radicals, etchants, subsequent photoresist layers, lithographic developers, and other chemicals, solvents, materials, and treatments that may be applied during subsequent processing steps. The modification of these surfaces may be enhanced with a high temperature bake at, for example, 100-250 degrees (temperatures that may be above the glass transition temperatures of the resist).

Figure 12:
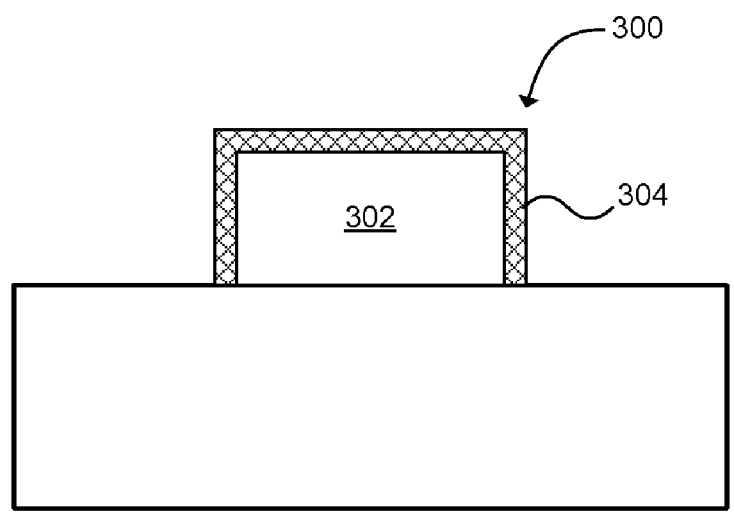
FIG. 12 is a cross sectional view illustrating a feature of a stabilized photoresist layer.

FIG. 12 is a cross sectional view of a feature 300 of a stabilized photoresist layer. This feature 300 includes photoresist material 302 having an unmodified composition. For example, photoresist material 302 may have the same general composition as feature 210, feature 212, and feature 214 in patterned photoresist layer 208. The exposure of the outer surfaces of the feature 300 to the stabilizing radiation, however, modifies the outer surfaces such that they resemble a modified crust or shell 304 over the remaining photoresist material 302. The shell 304 represents a chemically and structurally changed composition relative to the composition of photoresist material 302. Shell 304 will typically be very thin relative to the overall dimensions of feature 300. For example, if feature 300 is 100 nm wide and 100 nm high, shell 304 may only be about 5 nm thick.

Figure 6:
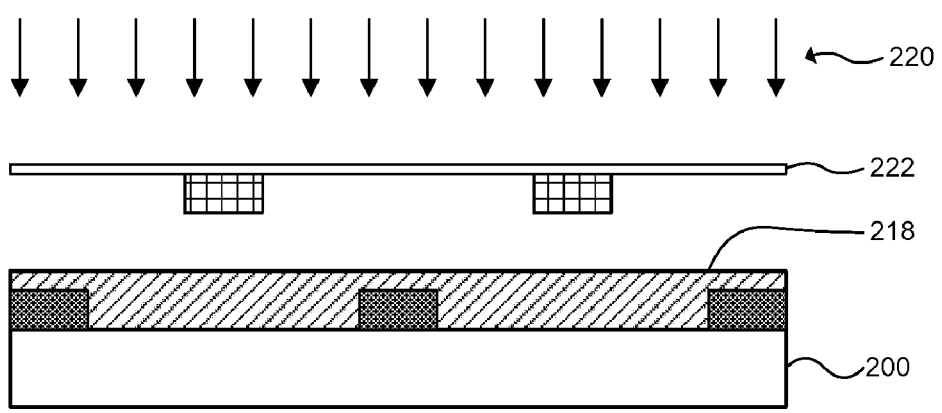

Although other IC circuit fabrication steps or sub-processes may be performed after the patterned photoresist layer 208 has been stabilized, this example continues with a second lithographic sub-process associated with a double exposure process. In this regard, after stabilizing the patterned photoresist layer 208, a second photoresist layer is formed over the semiconductor substrate. FIG. 6 depicts the second photoresist layer 218 after it has been disposed over the treated structure shown in FIG. 5. Second photoresist layer 218 may (but need not) utilize the same type of photoresist material that is used for photoresist layer 202 (see FIG. 2). FIG. 6 also depicts the patterning of second photoresist layer 218; this second patterning step may be similar to the first patterning step described above in the context of FIG. 3. Thus, radiating light 220 having an appropriate wavelength is exposed to second photoresist layer 218 using a second mask or reticle 222 that contains a desired pattern. In this example, second mask or reticle 222 defines a pattern that cooperates with the first patterned photoresist layer 208. Thus, the pattern or image provided on mask or reticle 222 is transferred to second photoresist layer 218, which chemically reacts to the radiation 220.

Figure 7:
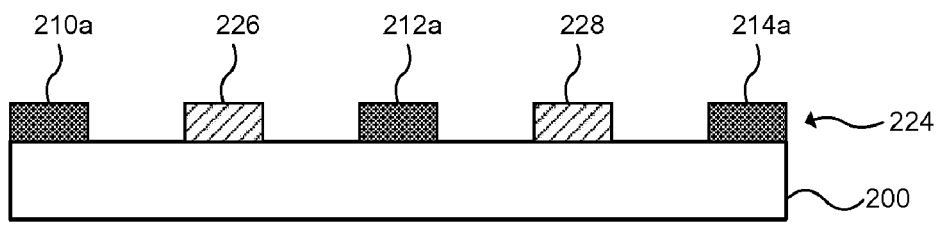

Next, the wafer, including the exposed second photoresist layer 218, undergoes development to form a double patterned photoresist layer. FIG. 7 depicts the resulting double patterned photoresist layer 224. This second developing step eliminates some of the second photoresist layer 218 to define features (such as a feature 226 and a feature 228) in double patterned photoresist layer 224, where a given feature may define or represent any of the elements described above in connection with FIG. 4. Notably, the transformed and stabilized features 210a/212a/214a can withstand the second lithographic sub-process and, in particular, the second development step. In other words, the stabilized features remain virtually unchanged and do not experience shrinkage or dimensional distortion. If desired, the newly created features may also be subjected to stabilizing radiation (possibly using a mask to protect the stabilized features 210a/212a/214a) and/or baking. Although not depicted in the figures, the wafer may undergo more than two lithographic sub-processes in this manner.

Figure 8:
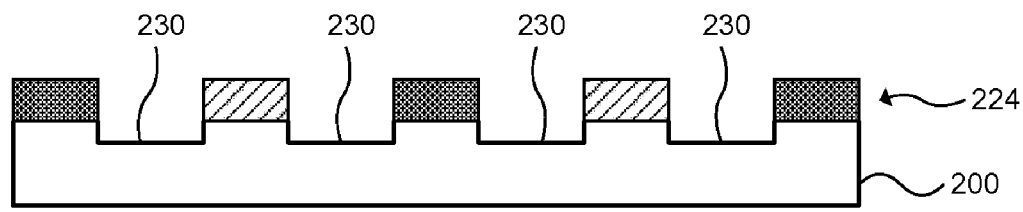

In accordance with one embodiment, the double patterned photoresist layer 224 is utilized during an etching step where an area of the target material (e.g., semiconductor substrate 200) is etched away. FIG. 8 depicts the result of such an etching step, where areas of the target material that are unprotected or uncovered by the double patterned photoresist layer 224 are etched, forming etched areas 230 in the target material. Although not depicted in the figures, the double patterned photoresist layer 224 can be removed after the etching step to facilitate further processing of the wafer as needed. Notably, the stabilization of the first patterned photoresist layer 208 enables a double exposure process that need not rely on multiple etching steps.

Figure 9:
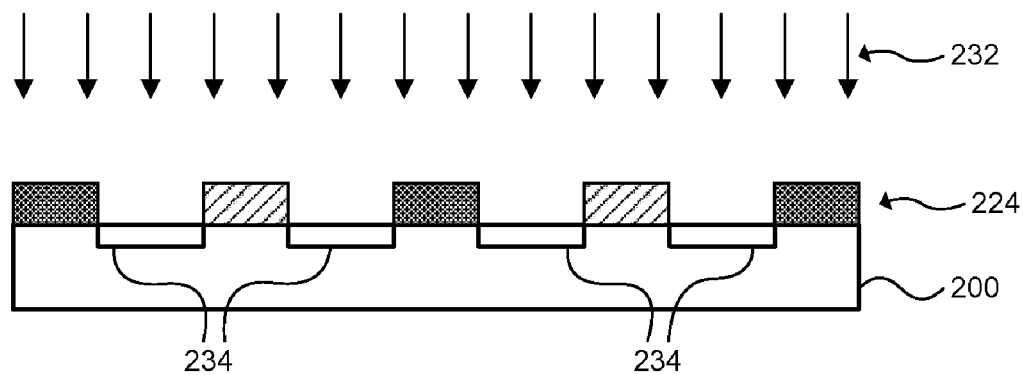
FIG. 9 is a cross sectional view illustrating a double-exposed wafer undergoing ion implantation.

In accordance with another embodiment, the stabilized photoresist layer 224 is utilized during an ion implantation step where an area of the target material (e.g., semiconductor substrate 200) is radiated with ions. FIG. 9 depicts implanting of ions in this manner, where areas of the target material that are unprotected or uncovered by the double patterned photoresist layer 224 are radiated with ions 232, forming doped regions 234 in the target material. Although not depicted in the figures, the double patterned photoresist layer 224 can be removed after the ion implantation step to facilitate further processing of the wafer as needed.

Figure 10:
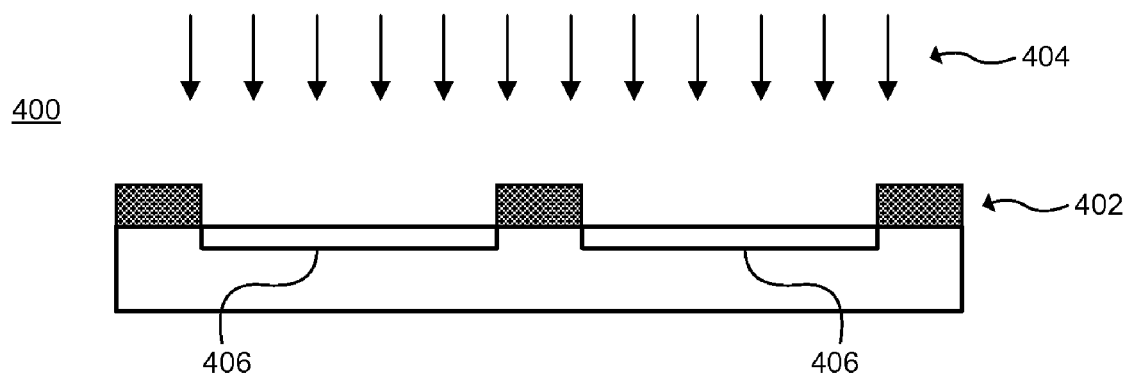
FIG. 10 is a cross sectional view illustrating a single-exposed wafer undergoing ion implantation.

The photoresist modification technique described above may also be utilized in a semiconductor device fabrication process having only one lithographic sub-process. For example, the structure depicted in FIG. 5 may define a desired etching or ion implantation pattern. A stabilized photoresist layer may be desirable for applications where intense etching or intense ion implantation might otherwise distort, melt, or destroy an untreated photoresist layer. In this regard, FIG. 10 is a cross sectional view of a single-exposed wafer 400 undergoing ion implantation (as described above in connection with FIG. 9). Wafer 400 includes a stabilized photoresist layer 402 that defines an ion implantation mask for ions 404 bombarding wafer 400. In accordance with known ion implantation techniques, ions 404 create doped regions 406 in the target material of wafer 400.

Figure 11:
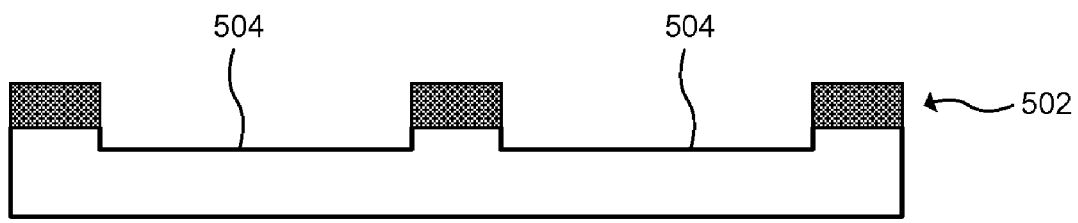
FIG. 11 is a cross sectional view illustrating a single-exposed wafer after etching.

FIG. 11 is a cross sectional view of a single-exposed wafer 500 after etching. Wafer 500 includes a stabilized photoresist layer 502 that defines an etch mask for wafer 500. In accordance with known etching techniques, areas of the target material of wafer 500 that are unprotected or uncovered by the stabilized photoresist layer 502 are etched, forming etched areas 504 in the target material.

While at least one embodiment has been presented in the foregoing detailed description, it should be appreciated that a vast number of variations exist. It should also be appreciated that the embodiment or embodiments described herein are not intended to limit the scope, applicability, or configuration of the invention in any way. Rather, the foregoing detailed description will provide those skilled in the art with a convenient road map for implementing the described embodiment or embodiments. It should be understood that various changes can be made in the function and arrangement of elements without departing from the scope of the invention, where the scope of the invention is defined by the claims, which includes known equivalents and foreseeable equivalents at the time of filing this patent application.

What is claimed is:

1. An integrated circuit fabrication method comprising:

patterning a first photoresist layer from a photoresist material disposed over a target material by exposing the first photoresist layer to radiation having a deep ultraviolet wavelength, resulting in an exposed first photoresist layer;

developing the exposed first photoresist layer into a patterned first photoresist layer;

stabilizing the patterned first photoresist layer by exposing the patterned first photoresist layer to radiation having a wavelength for which the patterned first photoresist layer is highly absorptive, resulting in stabilized photoresist features;

thereafter, forming a second photoresist layer over the target material and over the stabilized photoresist features, the second photoresist layer being formed from the same photoresist material used for the first photoresist layer;

patterning the second photoresist layer, while the stabilized photoresist features remain intact, by exposing the second photoresist layer to radiation, resulting in an exposed second photoresist layer;

developing the exposed second photoresist layer into a patterned second photoresist layer, while the stabilized photoresist features remain intact, wherein the patterned second photoresist layer has second photoresist features defined therein, wherein the stabilized photoresist features and the second photoresist features together define a combined mask for the target material, and wherein the stabilized photoresist features and the second photoresist features are separated such that they define unprotected areas of the target material therebetween;

thereafter, utilizing the combined mask during a subsequent process step for the unprotected areas of the target material; and thereafter, removing the stabilized photoresist features and the second photoresist features from the target material.

2. A method according to claim 1, wherein:

the patterned first photoresist layer includes at least one feature having a top surface and side surfaces; and stabilizing the patterned first photoresist layer comprises transforming the top surface and the side surfaces into modified surfaces.

3. A method according to claim 1, wherein:

the patterned first photoresist layer includes at least one feature having a top surface and side surfaces; and stabilizing the patterned first photoresist layer comprises cross-linking the patterned first photoresist layer proximate the top surface and the side surfaces.

4. A method according to claim 1, wherein:

patterning the first photoresist layer comprises exposing the first photoresist layer to radiation having a wavelength of 248 nanometers; and stabilizing the patterned first photoresist layer comprises exposing the patterned first photoresist layer to radiation having a wavelength that does not exceed 220 nanometers.

5. A method according to claim 1, wherein:

patterning the first photoresist layer comprises exposing the first photoresist layer to radiation having a wavelength of 193 nanometers; and stabilizing the patterned first photoresist layer comprises exposing the patterned first photoresist layer to radiation having a wavelength that does not exceed 180 nanometers.

6. A method according to claim 1, wherein utilizing the combined mask comprises etching an area of the target material that is unprotected by the stabilized photoresist features and the second photoresist features.

7. A method according to claim 1, wherein utilizing the combined mask comprises implanting ions into an area of the target material that is unprotected by the stabilized photoresist features and the second photoresist features.

8. A method according to claim 1, further comprising, after stabilizing the patterned first photoresist layer, performing a bake process to further stabilize the patterned first photoresist layer.

9. An integrated circuit fabrication method comprising:

applying a deep ultraviolet photoresist material over a semiconductor substrate;

exposing the deep ultraviolet photoresist material with patterned radiation having a first wavelength for which the deep ultraviolet photoresist material is transparent, resulting in exposed deep ultraviolet photoresist material;

developing the exposed deep ultraviolet photoresist material into a patterned first photoresist layer having at least one feature having an outer surface;

modifying the outer surface by exposing the patterned first photoresist layer to radiation having a second wavelength for which the patterned first photoresist layer is opaque, resulting in stabilized photoresist features;

thereafter, forming a second photoresist layer of the deep ultraviolet photoresist material over the semiconductor substrate;

patterning the second photoresist layer by exposing the second photoresist layer with radiation, resulting in an exposed second photoresist layer, wherein the stabilized photoresist features remain unchanged and do not experience shrinkage or dimensional distortion during patterning of the second photoresist layer;

developing the exposed second photoresist layer into a patterned second photoresist layer having second photoresist features defined therein, wherein, while developing the exposed second photoresist layer the stabilized photoresist features remain unchanged and do not experience shrinkage or dimensional distortion, wherein the stabilized photoresist features and the second photoresist features together define an ion implantation or etch mask, and wherein the stabilized photoresist features and the second photoresist features are separated such that they define unprotected areas of the target material therebetween;

thereafter, utilizing the ion implantation or etch mask for ion implantation or etching of the unprotected areas of the target material; and thereafter, removing the ion implantation or etch mask from the target material.

10. A method according to claim 9, further comprising transforming the composition of the deep ultraviolet photoresist material proximate the outer surface.

11. A method according to claim 9, wherein exposing the patterned first photoresist layer to radiation having the second wavelength further comprises cross-linking the deep ultraviolet photoresist material proximate the outer surface.

12. A method according to claim 9, wherein:

exposing the deep ultraviolet photoresist material comprises exposing the deep ultraviolet photoresist material with patterned radiation having a wavelength of 248 nanometers; and modifying the outer surface comprises exposing the patterned first photoresist layer to radiation having a wavelength that does not exceed 220 nanometers.

13. A method according to claim 9, wherein:

exposing the deep ultraviolet photoresist material comprises exposing the deep ultraviolet photoresist material with patterned radiation having a wavelength of 193 nanometers; and modifying the outer surface comprises exposing the patterned first photoresist layer to radiation having a wavelength that does not exceed 180 nanometers.

14. A method according to claim 9, further comprising, after modifying the outer surface, performing a bake process to stabilize the patterned first photoresist layer.

15. An integrated circuit fabrication method comprising:

depositing a deep ultraviolet photoresist material over a target material;

patterning the deep ultraviolet photoresist material by exposing it to radiation having a wavelength of 193 nanometers, resulting in exposed deep ultraviolet photoresist material;

developing the exposed deep ultraviolet photoresist material into patterned photoresist material having at least one feature with an outer surface;

exposing the patterned photoresist material to radiation having a wavelength that does not exceed 180 nanometers to cross-link the patterned photoresist material proximate the outer surface, resulting in stabilized photoresist features;

after exposing the patterned photoresist material, forming a second photoresist layer over the target material, the second photoresist layer being formed from the deep ultraviolet photoresist material used during the depositing step;

patterning the second photoresist layer by exposing the second photoresist layer to radiation, resulting in an exposed second photoresist layer, wherein the stabilized photoresist features remain unchanged and do not experience shrinkage or dimensional distortion during patterning of the second photoresist layer;

developing the exposed second photoresist layer into a patterned second photoresist layer having second photoresist features, wherein the stabilized photoresist features remain unchanged and do not experience shrinkage or dimensional distortion during developing of the exposed second photoresist layer;

thereafter, using the stabilized photoresist features and the second photoresist features together as an ion implantation or etch mask for the target material; and thereafter, removing the stabilized photoresist features and the second photoresist features.

16. A method according to claim 15, wherein the deep ultraviolet photoresist material is highly absorptive of radiation having a wavelength that does not exceed 180 nanometers.

17. A method according to claim 15, further comprising, after exposing the patterned photoresist material to radiation, performing a bake process to stabilize the patterned photoresist material.

* * * * *